United States Patent
Scheffer et al.

(10) Patent No.: US 7,533,359 B2
(45) Date of Patent: May 12, 2009

(54) METHOD AND SYSTEM FOR CHIP DESIGN USING PHYSICALLY APPROPRIATE COMPONENT MODELS AND EXTRACTION

(75) Inventors: Louis K. Scheffer, Campbell, CA (US); Joel R. Phillips, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 158 days.

(21) Appl. No.: 11/437,583

(22) Filed: May 19, 2006

(65) Prior Publication Data
US 2006/0265680 A1    Nov. 23, 2006

Related U.S. Application Data

(60) Provisional application No. 60/683,428, filed on May 20, 2005.

(51) Int. Cl.
*G06F 17/50* (2006.01)
*G06F 19/00* (2006.01)

(52) U.S. Cl. .............................. 716/5; 700/98; 700/110; 700/120; 700/121

(58) Field of Classification Search ..................... 716/5; 700/98, 110, 120, 121
See application file for complete search history.

(56) References Cited

U.S. PATENT DOCUMENTS

| | | | | |
|---|---|---|---|---|
| 5,563,801 A * | 10/1996 | Lee et al. | ...................... | 716/16 |
| 6,219,630 B1 * | 4/2001 | Yonezawa et al. | ............. | 703/14 |
| 6,393,601 B1 * | 5/2002 | Tanaka et al. | .................. | 716/2 |
| 6,418,353 B1 * | 7/2002 | Rostoker et al. | ............ | 700/121 |
| 6,430,729 B1 | 8/2002 | Dewey et al. | | |
| 6,453,447 B1 * | 9/2002 | Gardner et al. | .................. | 716/3 |
| 6,804,809 B1 * | 10/2004 | West et al. | ..................... | 716/11 |
| RE38,900 E * | 11/2005 | Rostoker et al. | .............. | 438/14 |
| 7,117,460 B2 * | 10/2006 | Chang et al. | .................... | 716/4 |
| 7,275,227 B1 * | 9/2007 | Ying | ............................. | 716/5 |
| 7,290,234 B2 * | 10/2007 | Shibayama | .................. | 716/11 |
| 2002/0073388 A1 * | 6/2002 | Orshansky et al. | ............. | 716/5 |
| 2003/0192013 A1 | 10/2003 | Cote et al. | | |
| 2005/0198603 A1 * | 9/2005 | Chang et al. | ................... | 716/8 |
| 2005/0261797 A1 * | 11/2005 | Cyr et al. | .................... | 700/121 |
| 2006/0288321 A1 * | 12/2006 | Shibayama | ..................... | 716/8 |
| 2007/0033554 A1 * | 2/2007 | Tsukiyama et al. | ............ | 716/4 |

OTHER PUBLICATIONS

Pack, R. et al. "Physical & Timing Verification of Subwavelength-Scale Designs—Part I: Lithography Impact on MOSFETS" Proceedings of the SPIE, Bellingham, VA, Feb. 23, 2003, vol. 5042, pp. 51-62.
International Search Report and Written Opinion dated Apr. 17, 2007 for PCT/US2006/019386.

* cited by examiner

*Primary Examiner*—Phallaka Kik
(74) *Attorney, Agent, or Firm*—Vista IP Law Group, LLP.

(57) ABSTRACT

An improved method, system, and computer program product is disclosed for predicting the geometric model of transistors once manufacturing and lithographic process effects are taken into consideration. This provides a much more accurate approach for modeling transistors since it is the actual expected geometric shapes that are analyzed, rather than an idealized model of the layout that does not accurately correspond to the actual manufactured IC product. The expected geometric shape includes systematic variations, which can be determined based on the layout, and the expected random variations, which can be determined based on the lithographic process.

29 Claims, 5 Drawing Sheets

METHOD AND SYSTEM FOR CHIP DESIGN USING PHYSICALLY APPROPRIATE COMPONENT MODELS AND EXTRACTION

CROSS-REFERENCE TO RELATED APPLICATIONS

The present application claims the benefit of U.S. Provisional Application No. 60/683,428, filed May 20, 2005, the entire disclosure of which is hereby incorporated by reference herein. The present application is also related to co-pending utility application Ser. No. 11/437,794, entitled "Method and System for Increased Accuracy for Extraction of Electrical Parameters," with attorney docket number 7040432001, filed on even date herewith. That application is herein incorporated by reference in its entirety.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. Extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools.

In modern design and extraction systems, component parameters for a transistor are defined by only a few theoretical geometric properties, such as length (L), width (W), area of source (AS) and area of drain (AD) and in some cases other relatively simplistic geometric properties of the transistor. These identified theoretical geometric properties are then used to determine electrical characteristics and/or the theoretical geometric properties are calculated based on required electrical properties for the transistor.

To test an integrated circuit layout, the integrated circuit designer 'extracts' electrical characteristics or geometric properties from the integrated circuit layout using an extraction application program. Then, the integrated circuit designer analyzes and possibly simulates the integrated circuit using the extracted electrical characteristics or geometric properties. If the analysis or simulation shows undesired operation of the integrated circuit, then the layout of the integrated circuit must be changed to correct the undesired operation. In addition, the analysis or simulation may also be used to determine the power consumption or operating speed of the integrated circuit. The analysis or simulation may therefore be used in conjunction with the design phase to optimize or the performance of the integrated circuit by adjusting the power consumption or speed.

One problem with conventional EDA tools that perform extraction is that they do not adequately address manufacturing effects that may occur during fabrication of the IC product. In particular, conventional EDA tools that perform extraction cannot adequately address the deviations that exist between the intended and regular-featured geometric shapes that are designed for the IC product, and the non-regular-featured geometric shapes that actually result from combination of OPC, mask making, lithographic, deposition, and etching processes (collectively referred to as the manufacturing process).

The actual shape of a circuit component may differ from the desired shape based on at least two factors. Firstly, neighboring components may affect the shape of a circuit component, because of spacing rules that are used to minimize interactions between components and take the limitations of the lithographic process into account. These are systematic variations that can in theory be determined from the design, for example, by examining the surrounding polygons. Secondly, random variations can affect the shape of a circuit component. Random variations are not determined by the environment, but instead by random factors, such as local variations in the photo-resist, that are not under the designer's control.

Many properties of transistors, such as leakage current, power usage, yield, capacitance, and timing, are dependent on the shape of the transistor. Because many modern systems use a simplistic transistor model, in which the transistors are assumed to be rectangular in shape, extraction and analysis can misestimate these properties of the transistors. As a result, analysis and testing may give an inaccurate representation of the integrated circuit.

These problems are further exacerbated by modern circuit design and manufacturing processes, in which surface area on an IC chip has become one of the most critical design factors. As designers and manufactures are forced to squeeze more and more circuitry onto less and less space, spacing of components on the circuits has reduced significantly. As component spacing is reduced, interactions between components is increased and in particular, the geometry of individual components can be impacted by the component's neighboring components, thus impacting electrical parameters. Levels of imperfections and error percentages that were insignificant and acceptable in older designs with the larger feature sizes and spacing have now become problematic and much more significant for modern designs having much smaller feature sizes and smaller spacing. Modern design and analysis systems and tools cannot accurately account for such geometric impacts. Therefore, what is needed is a method and system for using physically appropriate component models for extraction of electrical parameters.

SUMMARY

Methods and systems are provided that enable the actual shape of a transistor or other circuit component to be accurately modeled. Due to systematic variations and random variations, the shape of a transistor may deviate from the desired shape. The actual shape of a transistor or other circuit component may be expressed as the variation of width as a function of the length of the transistor.

Implementations provide for modeling of the actual shape of a transistor, based both on systematic variations, which can be determined from the circuit design, and on random variations. Random variations, also referred to as "line edge roughness," are not determined by the environment, but instead by random factors, such as local variations in the photo-resist and other factors that are not under the designer's control. However, the amount of this variation induced, and its characteristics, are determined by the lithography method used. Thus, a mathematical model of the lithography method can be used to determine the amount of random variation that is to be expected.

In one implementation, a method for extracting transistor parameters from an IC layout includes receiving a proposed IC layout, the proposed IC layout including a transistor, and receiving a model of a proposed lithography process that may be used to produce the transistor. The method further includes evaluating, based on the proposed IC layout and the model of the proposed lithography process, the effect of the proposed lithography process on one or more parameters of the transistor.

DETAILED DESCRIPTION

Some embodiments of the invention are directed to a method, system, and computer program product for using physically appropriate component models for extraction of electrical parameters of an IC design. Instead of performing extraction upon the theoretical model of the layout geometries, extraction is performed upon the expected printed geometries of the printed layout. This provides a much more accurate approach for performing extraction since it is the actual expected geometric shapes that are analyzed, rather than an idealized model of the layout that does not accurately correspond to the actual manufactured IC product.

Figure 1:
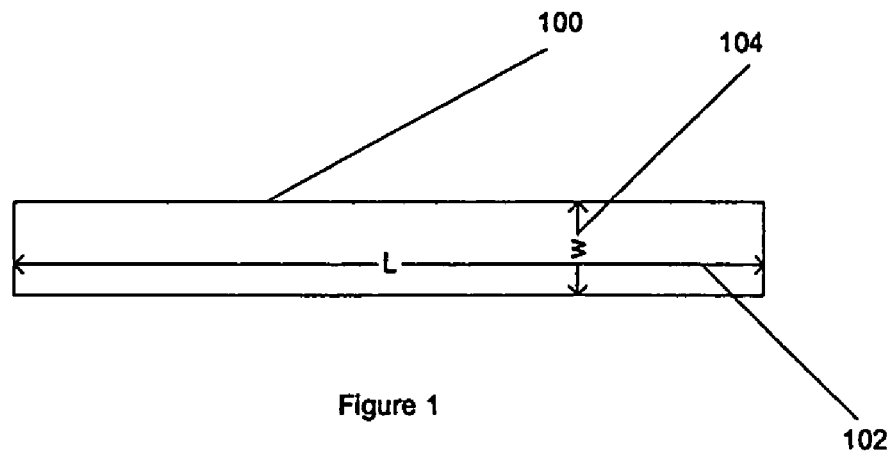
FIG. 1 depicts a theoretical model of a system component.

FIG. 1 depicts a theoretical model of a system component 100. In the embodiment shown in FIG. 1, a length (L) 102 and a width (W) 104 of the component have been identified. In the embodiment shown in FIG. 1, the length 102 and width 104 of the component are orthogonal and are consistent across the entire component 100. However, in theoretical alternate embodiments, the components can be piece-wise constant or can have linear variation. In still further alternate embodiments, the length and width may be other than orthogonal.

However, the actual shape of a circuit component may differ from the desired shape shown in FIG. 1. Firstly, neighboring components may affect the shape of a circuit component, because of spacing rules that are used to minimize interactions between components and take the limitations of the lithographic process into account. These are systematic variations that can in theory be determined from the design, for example, by examining the surrounding polygons. Secondly, random variations can affect the shape of a circuit component. Random variations are not determined by the environment, but instead by random factors, such as local variations in the photo-resist, that are not under the designer's control.

Figure 2:
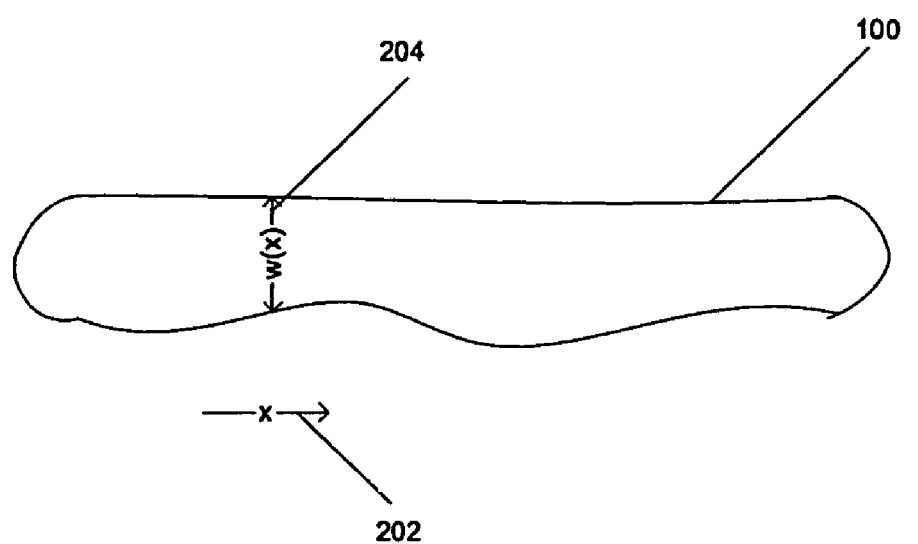
FIG. 2 depicts a representation of a fabricated component.

FIG. 2 depicts a physical representation of a fabricated component 200 based on the theoretical model shown in FIG. 1. As shown in FIG. 2, the actual shape of the fabricated component 200 may differ from the theoretical model. In the embodiment shown in FIG. 2, the width of the component 200 can be defined by an X-axis 202 that is substantially parallel to the length 102 of the theoretical component and a function w(x) 204. The function w(x) 204 can be any known and or convenient function which accurately defines the width of the physically manufactured component 200. The function w(x) can be determined using any known and/or convenient method or system can be in any known and/or convenient form. In some embodiments, the width of the component 200 can be determined based on experimental results, theoretical models of physical results, simulation, sensitivity analysis, silicon imaging and/or using any known and or convenient system or method. In some embodiments, a similar analysis can be used to generate a physical representation and a function for the length of the component as it varies across the width of the component.

Figure 3:
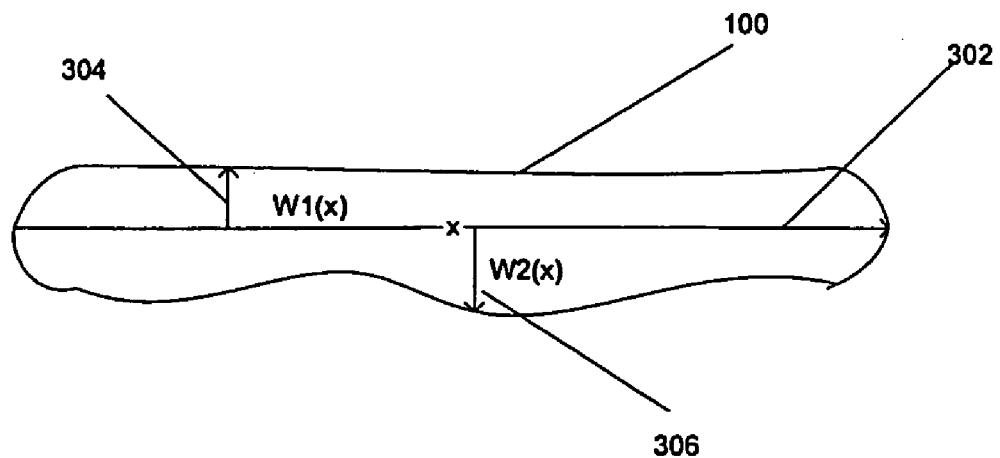
FIG. 3 depicts a second representation of a fabricated component.

FIG. 3 depicts an alternate embodiment of the fabricated component shown in FIG. 2. In the embodiment shown in FIG. 3, the boundaries of the component 200 can be defined by an X-axis 302 that is substantially centrally located within the component and parallel to the length 102 of the theoretical component and two functions $w_1(x)$ 304 and $W_2(x)$ 306. The functions $w_1(x)$ 304 and $w_2(x)$ 306 can be any known and or convenient functions which accurately define the boundaries of the physically manufactured component 200. The functions $w_1(x)$ 304 and $w_2(x)$ 306) can be determined using any known and/or convenient method or system and can be in any known and/or convenient form. In some embodiments, the boundaries of the component 200 can be determined based on experimental results, theoretical models of physical results, simulation, sensitivity analysis, silicon imaging and/or using any known and or convenient system or method. In some embodiments, a similar analysis can be used to generate a physical representation and a function for the length and/or transverse boundaries of the component as it varies across the width of the component. In alternate embodiments, the system can provide information regarding the mean width of the actual component and/or a standard deviation. In still further alternate embodiment, the actual functions can be determined and the mean width and standard deviation can be calculated based on the determined functions.

Figure 4:
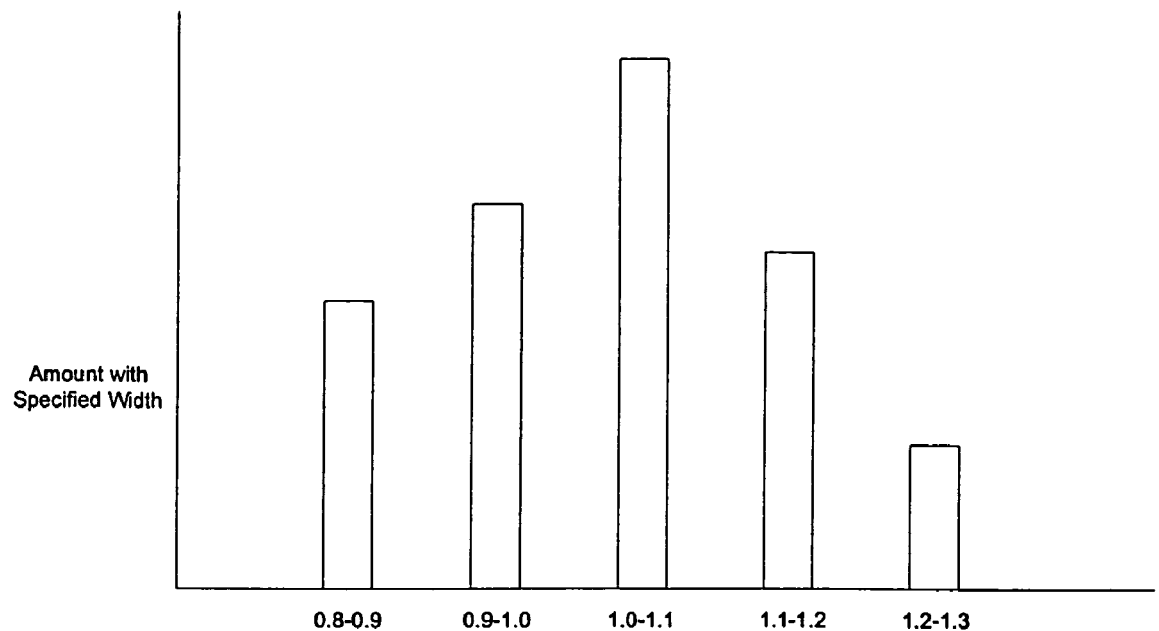
FIG. 4 depicts a histogram based on a fabricated component.

FIG. 4 depicts a histogram 400 of widths of the component at various points along the length. In the embodiment shown in FIG. 4, the X-axis 402 of the chart can represent width values of the component and the Y-axis 404 can represent frequency of occurrence of the widths. In alternate embodiments, any other known or convenient graphical, numerical and/or function based representation can be used to provide a user and/or system with information regarding the actual boundaries of the component.

As shown in FIG. 4, the histogram may illustrate the frequency of occurrence of various widths of a circuit component. However, as shown in FIG. 4, in some implementations, the histogram does not provide information on the ordering the segments within the circuit element. The histogram generated in FIG. 4 could have been generated by many different circuit elements with differing shapes, and it is therefore not possible to determine the overall shape of the circuit element directly from the histogram. For example, the circuit element generating the histogram of FIG. 4 could have a tapered, roughly triangular shape; could have a thinner midsection and wider endpieces, and thus be roughly dumbbell-shaped; or could have any of several other shape. However, the histogram of FIG. 4 may nonetheless contain enough information for an acceptable extraction.

For many of the properties of concern to designers, the relative or absolute order of the segments of a variable width transistor makes little difference. Consider, for example, a transistor 900 nm wide, with a nominal length of 100 nm. Suppose that due to processing variations, the first third has an as-built length of 90 nm, the second 95 nm, and the third 105 nm. For the purposes of the simulation, it is unimportant to determine which third has which length. It is sufficient to know the three different lengths exist, and each takes ⅓ of the width.

The order of the segments making up the transistor is unimportant in some embodiments because almost all of the properties of concern to designers are summed over the whole length of the transistor. For example, a designer might be concerned with gate capacitance, which is nearly proportional to gate area. As the area of the gate does not depend on the order in which the segments are considered, the order of the segments is not necessary to model the gate capacitance. Another property of interest to the designer is timing. Timing is determined by the on-current of the devices, is which summed across all of the segments. Again the order of the segments is not necessary to model the timing. Yet another example is leakage current. Leakage current depends on length in a very different way than on-current, but once again only the total matters, so the order of the segments is not necessary to model the leakage current. Because the order of the segments is unimportant when performing these calculations, a transistor can be represented in a compact form, such as in the histogram of FIG. 4, that simply states how much of each different width exists, without specifying the order.

In other embodiments, the order of the segments making up the transistor may be considered. For example, the order of the circuit elements could affect the overlapping areas between layers of an integrated circuit. The overlap could affect one or more of the properties of the transistor or of the integrated circuit.

Histograms may also be used to store information how close the edges of neighboring circuit components are to the circuit component under consideration. For example, a circuit component with a total length of 500 nm may include 250 nm of length in which the nearest neighboring edge is between 85 and 87 nm away; 100 nm of length in which the nearest neighboring edge is between 87 and 89 nm away, and 50 nm of length in which the nearest neighboring edge is between 89 and 91 nm away. A histogram such as the histogram shown in FIG. 4 may be used to store this information. The information may be used, for example, to evaluate a proposed integrated circuit layout. In alternate implementations, neighboring edge information may be stored as a function of the length of the transistor, in a manner similar to that described above with reference to FIGS. 2-3.

The actual shape of a circuit component may differ from the desired shape based on at least two factors. Firstly, neighboring components may affect the shape of a circuit component, because of spacing rules that are used to minimize interactions between components and take the limitations of the lithographic process into account. These are systematic variations that can in theory be determined from the design, for example, by examining the surrounding polygons. The systematic variations can be determined from the integrated circuit design and represented using any of the methods discussed with reference to FIGS. 2-4, or any other convenient or appropriate method.

In contrast, random variations are not determined by the environment, but instead by random factors, such as local variations in the photo-resist, that are not under the designer's control. For this reason, the random variations cannot be determined based on the design alone. However, the amount of this variation induced, and its characteristics, are determined by the lithography method used. Thus, the lithography method used can be used to determine the expected amount of random variation.

In one implementation, various circuit components made using various lithography methods can be tested to determine the amount of random variation that is to be expected. In another implementation, a mathematical model of the lithography method used can be used in conjunction with the design to determine the amount of random variation that is to be expected.

Because the exact contours of the random variation cannot be predicted, the random variation cannot be expressed as an explicit function of length as shown in FIGS. 2-3. Instead, the random variation may be expressed, for example, as a spectral form, as is well known in the art, or as a histogram, as shown in FIG. 4.

In some implementations, both the systematic variations and the random variations may be expressed in the model of the circuit element. In this case, a histogram may be used to express the shape of the circuit element, or a mixed form may be used to express the shape of the circuit element. In the case of a mixed form, the systematic variations may be expressed as a function of L, as shown in FIGS. 2-3, and the random variations may be expressed as a spectral form. Other methods of expressing the systematic variations, the random variations, or the combination of systematic and random variations will occur to those skilled in the art.

Figure 4B:
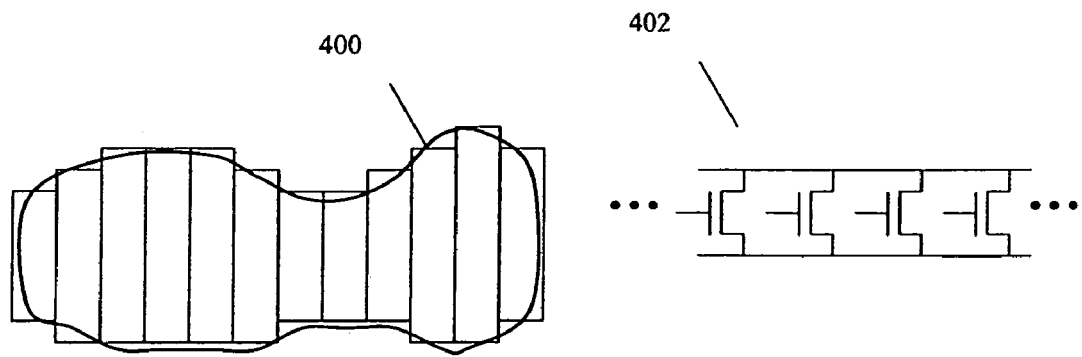
FIG. 4b depicts a conventional method of representing a fabricated component for extraction (prior art).

FIG. 4*b* illustrates a prior art approach to modeling a circuit element. As shown in FIG. 4*b*, a single transistor 400 may be modeled as a number of smaller, parallel transistors 402, each with a particular width. Such an approach is described, for example, in "Physical and Timing Verification of Subwavelength-Scale Designs: I. Lithography Impact on MOSFETs," by Robert C. Pack, et al., published in the Proceedings of SPIE—Volume 5042, Design and Process Integration for Microelectronic Manufacturing, July 2003, pp. 51-62.

However, this approach suffers from a number of deficiencies. This approach may be inefficient in terms of storage, as information must be stored for each of the parallel transistors, even though the transistors have the same source, gate, drain, and bulk. Furthermore, modeling computations must be performed for each of the parallel transistors, even though the model computations for each transistor are often very similar, if not identical. In addition, simulator performance may suffer due to the number of transistors that must be simulated.

In addition to these performance issues, the approach illustrated in FIG. 4b can provide inaccurate simulations. The transistor models used in simulations account for the electric fields, lithographic effects, and other effects at the edges of the transistors. When a single transistor is represented as a number of abutting transistors, as shown in FIG. 4b, the transistor models will consider the edge effects at each edge of each abutting transistor. Because the "edges" for the majority of these abutting transistors are not external edges abutting an empty region, but are rather internal edges abutting another transistor, inaccurate results may be obtained. For these reasons, a method represent a single physical transistor as a number of electrical transistors presents several drawbacks.

Figure 4C:
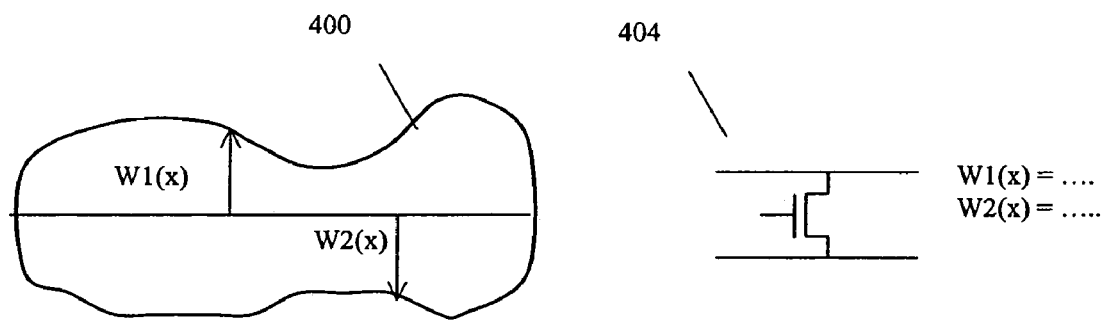
FIG. 4c depicts a method of representing a fabricated component for extraction.
Figure 4D:
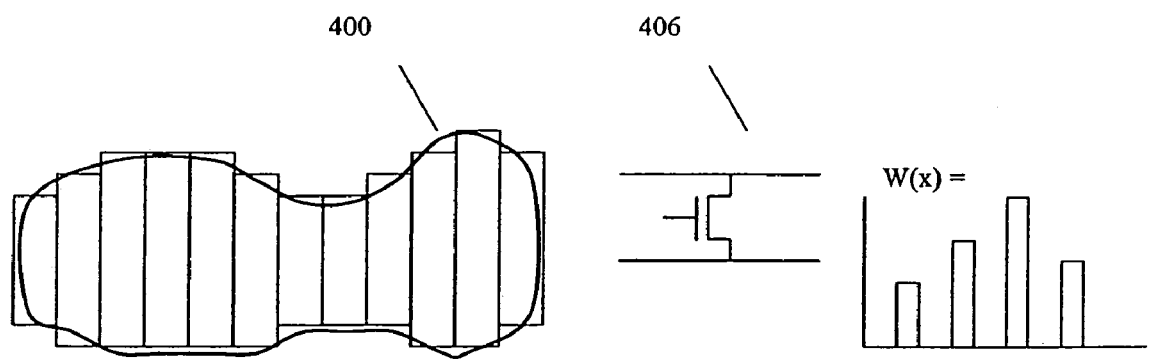
FIG. 4d depicts a method of representing a fabricated component for extraction.

In contrast to the prior art method shown in FIG. 4b, methods for representing a single physical transistor in a simulation are shown in FIGS. 4c-d. As shown in FIG. 4c, a transistor 400 may be represented by a functions w1($x$) and w2($x$), in a manner described with reference to FIG. 3. The functions may be, for example, linear functions, exponential functions, piecewise linear functions, piecewise exponential functions, step functions, or any other functions appropriate to describe the width of a transistor. For the purposes of simulation, the transistor 400 will be modeled as a single transistor 404, with a width described by the functions w1($x$) and w(2)x.

As shown in FIG. 4d, a transistor 400 may be represented by a histogram, in a manner described with reference to FIG. 4. For the purposes of simulation, the transistor 400 will be modeled as a single transistor 406, with a width described by the histogram.

Although not shown in FIGS. 4c-4d, a transistor may also be represented by a single function w(x), as described with reference to FIG. 2. The functions may be, for example, a linear function, an exponential function, a piecewise linear function, a piecewise exponential function, a step function, or any other function appropriate to describe the width of a transistor. For the purposes of simulation, the transistor will be modeled as a single transistor, with a width described by the function w(x).

The actual shape of a circuit component may differ from the desired shape based on systematic variations and based on random variations. As discussed above, the models used to represent the circuit component may include the systematic variations, the random variations, or both the systematic and random variations.

Figure 5:
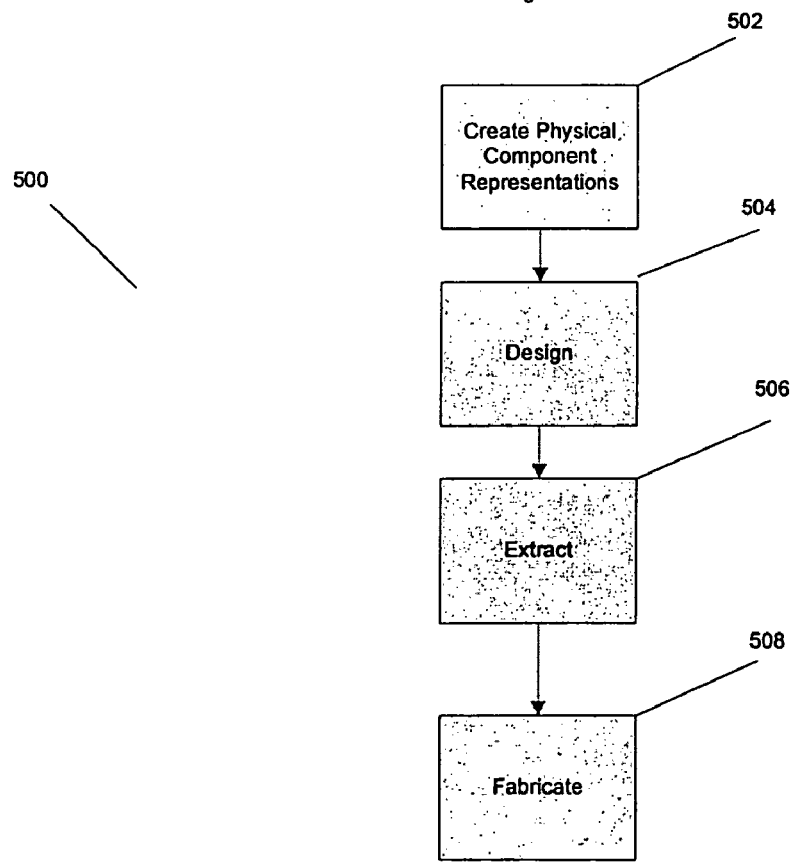
FIG. 5 depicts a flow chart of the use of accurate physical component representations.

FIG. 5 depicts a flow chart 500 of a chip design using physically appropriate component models and extraction. In step 502 graphical, numerical and/or function based representations of the various physical components of a circuit are created. The representations can be created using the methods and systems described above with regards to FIGS. 2, 3, 4, 4c, and 4d, and/or using any other known and/or convenient method. The models used to represent the circuit component may include the systematic variations, the random variations, or both the systematic and random variations.

In step 504 design of the circuit is completed using electrical and layout models based on the representations created in step 502. Any known and/or suitable method for electrical circuitry design can be used. Any conventional layout or place and route system/tool can be employed to perform the design action of 504. Those of ordinary skill in the art would realize that an initial verification action may occur in 504, e.g., a design rule check (DRC) to verify that the IC layout complies with mandated design rules.

In step 506, the design is extracted to produce physical and geometric properties of the components of the system. In some embodiments, the physical and geometric properties can, at least in part, be based on the representations created in step 502. In step 508, the design can be fabricated using any known and/or convenient method and/or system.

Figure 5B:
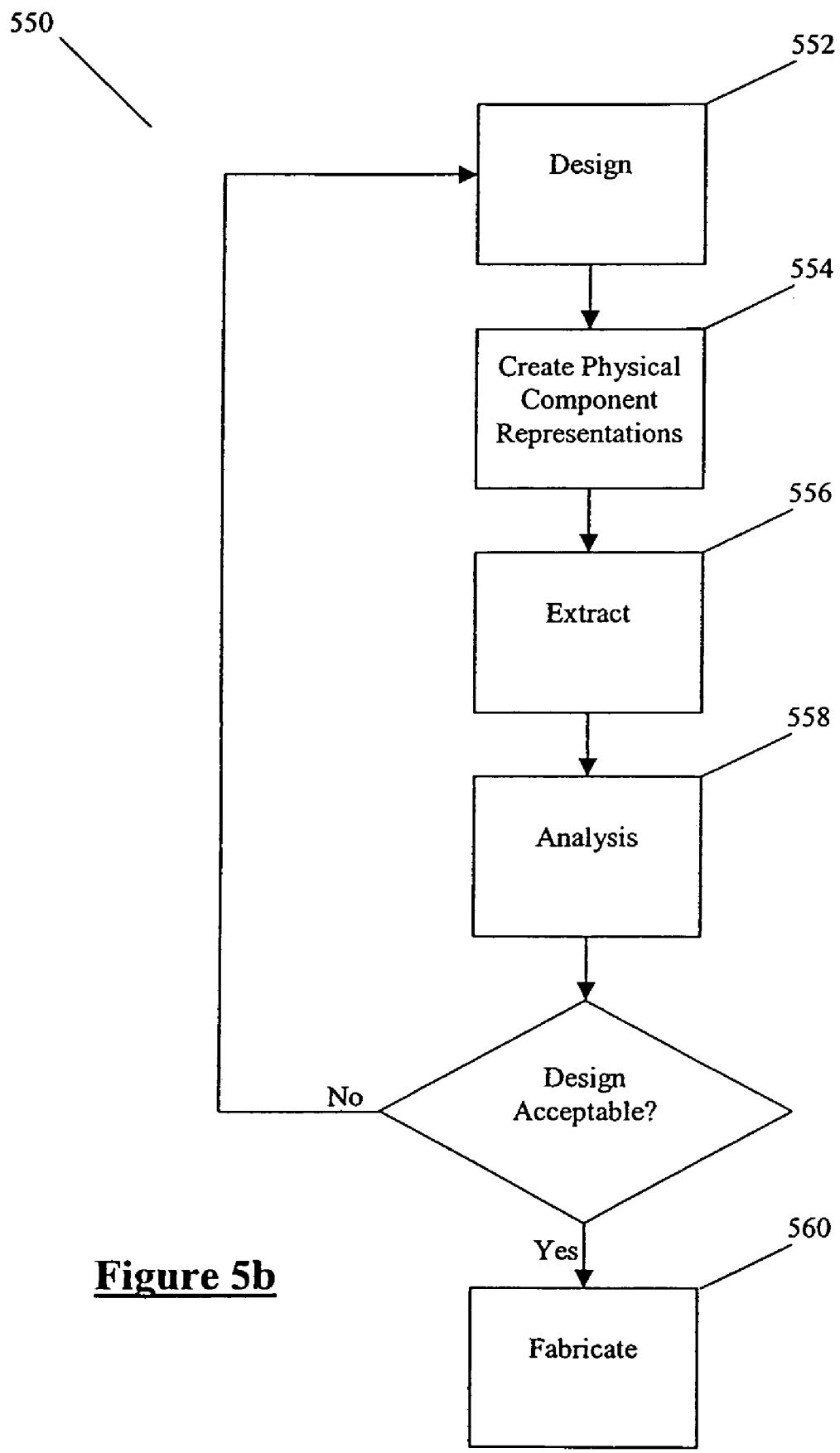
FIG. 5b depicts a flow chart of the use of accurate physical component representations.

FIG. 5b depicts a flow chart 550 of a chip design using physically appropriate component models and extraction. In step 552 design of the circuit is completed. Any known and/or suitable method for electrical circuitry design can be used. Any conventional layout or place and route system/tool can be employed to perform the design action of 552. Those of ordinary skill in the art would realize that an initial verification action may occur in 552, e.g., a design rule check (DRC) to verify that the IC layout complies with mandated design rules.

In step 554 graphical, numerical and/or function based representations of the various physical components of a circuit are created. The representations can be created using the methods and systems described above with regards to FIGS. 2, 3, 4, 4c, and 4d, and/or using any other known and/or convenient method. The physical component representations can be created, for example, based on the design of step 552 and/or various lithographic models describing the lithographic process. The models used to represent the circuit component may include the systematic variations, the random variations, or both the systematic and random variations.

The lithography equipment used to create an integrated circuit may vary from machine to machine, and may even vary in the same machine over time. Variation in the functioning of lithography equipment can be expressed as variation in focus and dose. It is desirable to create an integrated circuit design in which the circuit elements function regardless of expected or acceptable variations in the lithography equipment. In order to take into account the variations in the lithography equipment, in some cases, more than one model for a transistor may be produced, each model representing the shape of a transistor due to some expected or acceptable variation in the lithography equipment. These multiple models may be known as "corners." Alternatively, a single model or may be more complex to account for such variations in the lithography equipment. An example of such a model that depends on variation can be found in U.S. patent application Ser. No. 10/327,738, entitled "A method for accounting for process variation in the design of Ics," filed on Dec. 23, 2002. Other methods could be used.

The IC design and/or lithography process used to manufacture the IC product may include various enhancement or optimization techniques, such as for example, optical proximity correction (OPC) treatment, illumination, numerical aperture, nominal dose, and resist models. In some embodiments of the invention, a lithography model can include multiple ones of the above variables as parameters. In some alternative embodiments, a set of lithography models is employed, with each model specifying one parameter from the above set. In yet other embodiments, a combination of the two approaches can be employed for the lithography model (s). In other embodiments, the lithography model does not take into account any enhancement or optimization techniques such as OPC. Some examples of parameters that may be employed in a lithographic model include illuminator, wavelength, lens aperture, OPC, and resist model parameters.

In step 556, the design is extracted to produce physical and geometric properties of the components of the system. In some embodiments, the physical and geometric properties can, at least in part, be based on the representations created in step 554. Extraction may include finding the leakage current, power usage, yield, capacitance, and timing.

In step 558, analysis may be performed. Analysis may include a determination as to whether the design having the electrical properties as extracted for the printed image is acceptable. If the design is not acceptable with those extracted characteristics/properties, then the process returns back to 552 to reconfigure part or all of the design. Analysis of the electrical properties based on the extraction are described, for example, in "Experimental Investigation of the Impact of Line-Edge Roughness on MOSFET Performance and Yield," by J. A. Croon, et al., published in European Solid-State Device Research, 2003, Sep. 16-18 2003, p 227-230; "Line Edge Roughness: Characterization, Modeling and Impact on Device Behavior" by J. A. Croon, et al., published in Electron Devices Meeting 2002 IEDM '02 Digest International, Dec. 8-11 2002 p. 307-310; which are incorporated herein by reference in their entireties.

One type of determination that can be made in some embodiments is to identify whether the extracted capacitance, leakage current, power usage, and other electrical properties, whether individually or in combination, are acceptable. The electrical properties can be checked over either absolute or relative measures to determine the acceptability of the extracted values. The electrical properties, or their combination, can be checked for acceptability over a range of lithographic, e.g., dose and focus, and not just at nominal values, e.g., nominal dose and focus.

Another type of determination that can be made is to determine whether the design has acceptable timing properties. The cross-coupling effects of nearby interconnect geometries may negatively affect the electrical performance of the IC device by increasing delays which cause the IC to fail timing requirements. In some embodiments of the invention, timing analysis may be performed to verify whether the extraction data from 556 for the expected printed geometry would correspond to acceptable or unacceptable timing performance. If the timing performance for the design is not acceptable with those extracted characteristics/properties, then the process returns back to 552 to reconfigure part or all of the design to improve the timing performance of the unacceptable nets in the layout.

Step 558 can be performed to check whether the extracted electrical parameters would result in acceptable power performance for the IC layout. This type of determination can be made, for example, by analyzing the extracted transistor lengths and capacitance values for the printed geometries and comparing the power performance against expected power specifications for design intent for the IC design. This type of analysis is particularly useful for low power designs, such as is required for many modern mobile and portable devices such ICs in cellular phones and PDAs.

It is noted that the analysis can be performed against any granularity of structures within the IC design—with the above process performed on all or just a portion of an overall IC design. In some embodiments, the analysis is performed for particular nets. In some other embodiments, the above analysis is performed over a path or route over a set of two or more nets.

If in step 558 it is determined that the IC design having the electrical properties as extracted for the printed imaged is not acceptable, then the process returns back to 552 to reconfigure part or all of the design. For example, if compliance with lithographic rule is checked in step 558, and it is determined that the IC design corresponding to the extraction data does not comply with the lithographic rules, then the process/system can return to either the design step 552 and/or the extraction step 556 and attempt to design and/or extract a system which does comply with the lithographic rules. In some embodiments, the specific regions of the IC deemed not acceptable, e.g., the portion of the extracted layout not complying with the lithographic rules, can be identified such that the design step 552 and the extraction step 556 can focus only on the identified areas.

If it is determined that the extraction complies with the lithographic rules, then fabrication can be performed in step 560. Any known and/or convenient method and/or system can be used to for fabrication in step 560. As is well known to those skilled in the art, step 560 may include the act of taping out the final IC design, e.g., in GDSII format. The taped out design is used to manufacture the mask. The mask is then used to fabricate the IC product.

Figure 6:
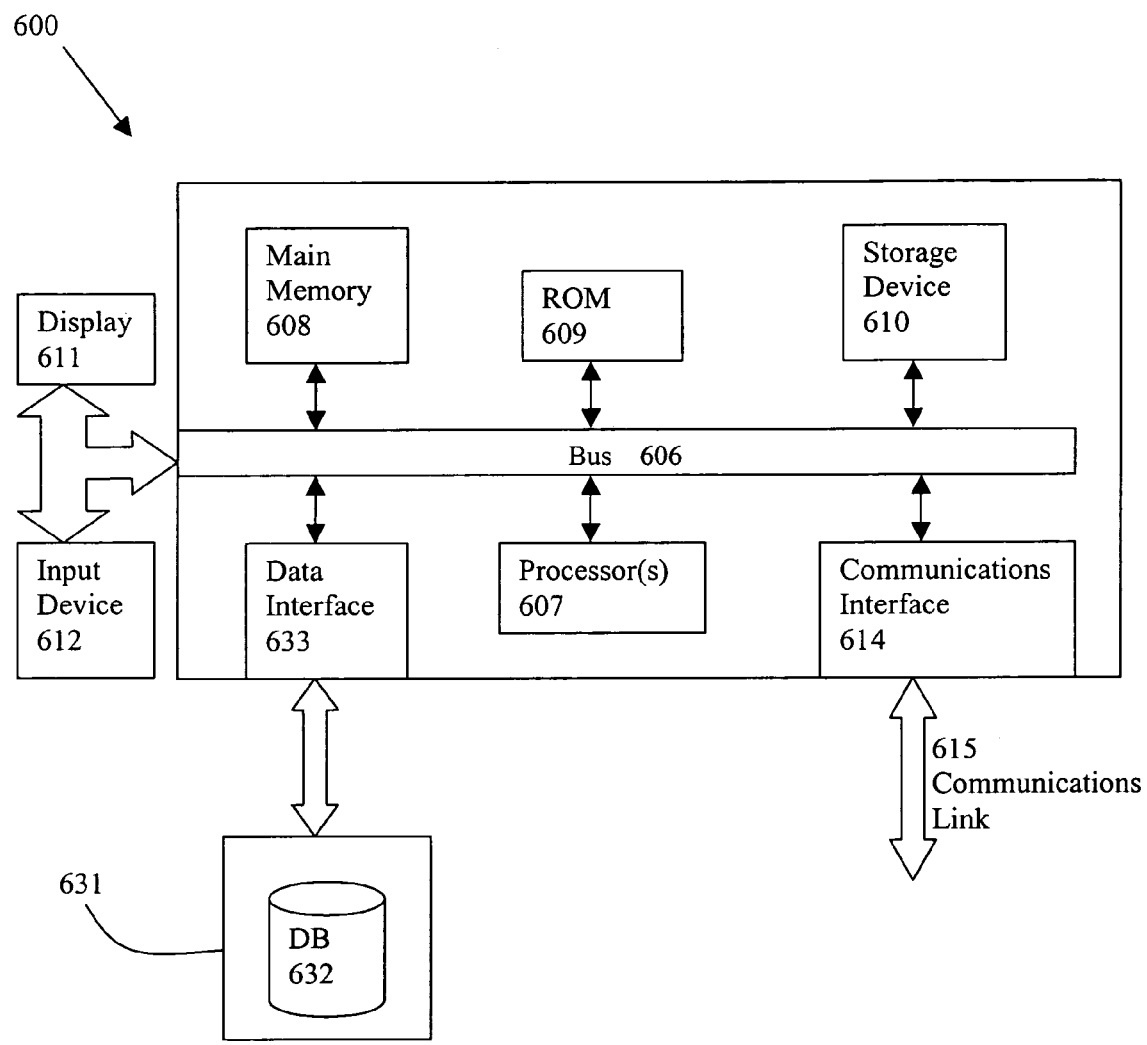
FIG. 6 depicts a computerized system on which a method for chip design using physically appropriate component models for extraction can be implemented.

The execution of the sequences of instructions required to practice the embodiments may be performed by a computer system 600 as shown in FIG. 6. In an embodiment, execution of the sequences of instructions is performed by a single computer system 600. According to other embodiments, two or more computer systems 600 coupled by a communication link 615 may perform the sequence of instructions in coordination with one another. Although a description of only one computer system 600 will be presented below, however, it should be understood that any number of computer systems 600 may be employed to practice the embodiments.

A computer system 600 according to an embodiment will now be described with reference to FIG. 6, which is a block diagram of the functional components of a computer system 600. As used herein, the term computer system 600 is broadly used to describe any computing device that can store and independently run one or more programs.

Each computer system 600 may include a communication interface 614 coupled to the bus 606. The communication interface 614 provides two-way communication between computer systems 600. The communication interface 614 of a respective computer system 600 transmits and receives electrical, electromagnetic or optical signals, that include data streams representing various types of signal information, e.g., instructions, messages and data. A communication link 615 links one computer system 600 with another computer system 600. For example, the communication link 615 may be a LAN, in which case the communication interface 614 may be a LAN card, or the communication link 615 may be a PSTN, in which case the communication interface 614 may be an integrated services digital network (ISDN) card or a modem, or the communication link 615 may be the Internet, in which case the communication interface 614 may be a dial-up, cable or wireless modem.

A computer system 600 may transmit and receive messages, data, and instructions, including program, i.e., application, code, through its respective communication link 615 and communication interface 614. Received program code may be executed by the respective processor(s) 607 as it is received, and/or stored in the storage device 610, or other associated non-volatile media, for later execution.

In an embodiment, the computer system 600 operates in conjunction with a data storage system 631, e.g., a data storage system 631 that contains a database 632 that is readily accessible by the computer system 600. The computer system 600 communicates with the data storage system 631 through a data interface 633. A data interface 633, which is coupled to the bus 606, transmits and receives electrical, electromagnetic or optical signals, that include data streams representing various types of signal information, e.g., instructions, messages and data. In embodiments, the functions of the data interface 633 may be performed by the communication interface 614.

Computer system 600 includes a bus 606 or other communication mechanism for communicating instructions, messages and data, collectively, information, and one or more processors 607 coupled with the bus 606 for processing information. Computer system 600 also includes a main memory 608, such as a random access memory (RAM) or other dynamic storage device, coupled to the bus 606 for storing dynamic data and instructions to be executed by the processor(s) 607. The main memory 608 also may be used for storing temporary data, i.e., variables, or other intermediate information during execution of instructions by the processor(s) 607.

The computer system 600 may further include a read only memory (ROM) 609 or other static storage device coupled to the bus 606 for storing static data and instructions for the processor(s) 607. A storage device 610, such as a magnetic disk or optical disk, may also be provided and coupled to the bus 606 for storing data and instructions for the processor(s) 607.

A computer system 600 may be coupled via the bus 606 to a display device 611, such as, but not limited to, a cathode ray tube (CRT), for displaying information to a user. An input device 612, e.g., alphanumeric and other keys, is coupled to the bus 606 for communicating information and command selections to the processor(s) 607.

According to one embodiment, an individual computer system 600 performs specific operations by their respective processor(s) 607 executing one or more sequences of one or more instructions contained in the main memory 608. Such instructions may be read into the main memory 608 from another computer-usable medium, such as the ROM 609 or the storage device 610. Execution of the sequences of instructions contained in the main memory 608 causes the processor(s) 607 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 607. Such a medium may take many forms, including, but not limited to, non-volatile and volatile media. Non-volatile media, i.e., media that can retain information in the absence of power, includes the ROM 609, CD ROM, magnetic tape, and magnetic discs. Volatile media, i.e., media that can not retain information in the absence of power, includes the main memory 608.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A method for extracting transistor parameters from an IC layout, comprising:
   receiving a proposed IC layout, the proposed IC layout including a transistor;
   receiving a model of a proposed manufacturing process, wherein the model of the proposed manufacturing process is used to approximate a variation of an actual profile of the transistor caused by the proposed manufacturing process; and
   evaluating, based on the proposed IC layout and the model of the proposed manufacturing process, an effect of the proposed manufacturing process on one or more parameters of the transistor, wherein the act of evaluating is performed by a processor.

2. The method of claim 1, wherein evaluating the effect of the proposed manufacturing process comprises determining whether the proposed IC layout is suitable for manufacturing with the proposed manufacturing process.

3. The method of claim 2, wherein determining whether the proposed IC layout is suitable comprises determining whether the proposed IC layout prints acceptably within a predetefi I lined range of focus and dose.

4. The method of claim 1, wherein the act of evaluating the effect of the proposed manufacturing process comprises computing width and length values for the transistor, and determining, based on the computed values, whether a circuit described by the IC layout will function correctly.

5. The method of claim 4, wherein the width values are expressed as a function of the length value.

6. The method of claim 4, wherein the width values are expressed as a histogram.

7. The method of claim 4, wherein the width values are expressed as expected amplitudes as a function of spatial frequency.

8. The method of claim 4, wherein the width values are expressed as a combination function comprising a systematic variation and an expected random variation.

9. The method of claim 1, wherein a plurality of models is generated for each transistor, each model corresponding to a unique set of manufacturing conditions.

10. The method of claim 1, wherein the model of the proposed manufacturing process comprises lithography conditions.

11. The method of claim 10, wherein the lithography conditions comprise a focus and a dose.

12. The method of claim 1, wherein evaluating the effect of the proposed manufacturing process comprises computing nearest neighboring edge values for the transistor; and determining, based on the computed values, whether a circuit described by the IC layout will function correctly.

13. The method of claim 12, wherein the nearest neighboring edge values are expressed as a function of the length value.

14. The method of claim 12, wherein the nearest neighboring edge values are expressed as a histogram.

15. A system for extracting transistor parameters from an IC layout, comprising:
   means for receiving a proposed IC layout, the proposed IC layout including a transistor;
   means for receiving a model of a proposed manufacturing process, wherein the model of the proposed manufacturing process is used to approximate a variation of an actual profile of the transistor caused by the proposed manufacturing process; and means for evaluating, based on the proposed IC layout and the model of the proposed manufacturing process, an effect of the proposed manufacturing process on one or more parameters of the transistor, wherein the means for evaluating comprises a processor.

16. The system of claim 15, wherein means for evaluating the effect of the proposed manufacturing process comprises means for determining whether the proposed IC layout is suitable for manufacturing with the proposed manufacturing process.

17. The system of claim 16, wherein means for determining whether the proposed IC layout is suitable comprises means for determining whether the proposed IC layout prints acceptably within a determined range of focus and dose.

18. The system of claim 15, wherein means for evaluating the effect of the proposed manufacturing process comprises means for computing width and length values for the transistor, and means for determining, based on the computed values, whether a circuit described by the IC layout will function correctly.

19. The system of claim 18, wherein the width values are expressed as a function of the length value.

20. The system of claim 18, wherein the width values are expressed as a histogram.

21. The system of claim 18, wherein the width values are expressed as expected amplitudes as a function of spatial frequency.

22. The system of claim 18, wherein the width values are expressed as a combination function comprising a systematic variation and an expected random variation.

23. The system of claim 15, further comprising means for generating a plurality of models for each transistor, each model corresponding to a unique set of manufacturing conditions.

24. The system of claim 15, wherein the model of the proposed manufacturing process comprises lithography conditions.

25. The system of claim 24, wherein the lithography conditions comprise a focus and a dose.

26. The system of claim 15, wherein means for evaluating the effect of the proposed manufacturing process comprises means for computing nearest neighboring edge values for the transistor, and means for determining, based on the computed values, whether a circuit described by the IC layout will function correctly 27. The system of claim 26, wherein the nearest neighboring edge values are expressed as a function of the length value.

28. The system of claim 26, wherein the nearest neighboring edge values are expressed as a histogram.

29. A computer program module embodied in a computer-usable medium, the computer program module comprising:

software executable to perform a method comprising:

receiving a proposed IC layout, the proposed IC layout including a transistor;

receiving a model of a proposed manufacturing process, wherein the model of the proposed manufacturing process is used to approximate a variation of an actual profile of the transistor caused by the proposed manufacturing process; and evaluating, based on the proposed IC layout and the model of the proposed manufacturing process, an effect of the proposed manufacturing process on one or more parameters of the transistor, wherein the act of evaluating is performed by a processor.

\* \* \* \* \*